United States Patent
Craig et al.

(10) Patent No.: US 7,246,268 B2
(45) Date of Patent: Jul. 17, 2007

(54) METHOD AND APPARATUS FOR DYNAMIC DEGRADATION DETECTION

(75) Inventors: Jeffrey Craig, Jackson, CA (US); John S. Mangan, Santa Cruz, CA (US)

(73) Assignee: SanDisk Corporation, Milpitas, CA (US)

( * ) Notice: Subject to any disclaimer, the term of this patent is extended or adjusted under 35 U.S.C. 154(b) by 503 days.

(21) Appl. No.: 10/051,833

(22) Filed: Jan. 16, 2002

(65) Prior Publication Data
US 2003/0135793 A1    Jul. 17, 2003

(51) Int. Cl.
    G06F 11/00    (2006.01)
(52) U.S. Cl. .............. 714/42; 714/57; 714/8
(58) Field of Classification Search ........... 714/42, 714/7, 8, 54, 57, 710, 711
See application file for complete search history.

(56) References Cited

U.S. PATENT DOCUMENTS

| | | | | |
|---|---|---|---|---|
| 4,586,178 A | * | 4/1986 | Bosse | 714/711 |
| 5,043,940 A | | 8/1991 | Harari | 365/168 |
| 5,268,870 A | | 12/1993 | Harari | |
| 5,602,987 A | | 2/1997 | Harari et al. | 395/182.06 |
| 5,633,824 A | * | 5/1997 | Onuki | 365/185.33 |
| 5,761,411 A | | 6/1998 | Teague et al. | 395/184.01 |
| 5,761,732 A | * | 6/1998 | Shaberman et al. | 711/157 |
| 5,828,583 A | | 10/1998 | Bush et al. | 364/551.01 |
| 5,835,930 A | * | 11/1998 | Dobbek | 711/4 |
| 5,841,711 A | * | 11/1998 | Watanabe | 365/200 |
| 5,890,192 A | | 3/1999 | Lee et al. | 711/103 |
| 5,963,474 A | | 10/1999 | Uno et al. | 365/185.04 |
| 6,016,530 A | * | 1/2000 | Auclair et al. | 711/6 |
| 6,047,352 A | * | 4/2000 | Lakhani et al. | 711/5 |
| 6,119,074 A | | 9/2000 | Sarangapani | 702/185 |
| 6,141,249 A | * | 10/2000 | Estakhri et al. | 365/185.11 |
| 6,149,316 A | * | 11/2000 | Harari et al. | 714/8 |
| 6,230,233 B1 | | 5/2001 | Lofgren et al. | 711/103 |

(Continued)

FOREIGN PATENT DOCUMENTS

EP    0 492 106 A1    7/1992

OTHER PUBLICATIONS

Merriam-Webster Inc., Webster's Ninth New Collegiate Dictionary, 1984, Merriam-Webster Inc., p. 611.*

(Continued)

*Primary Examiner*—Scott Baderman
*Assistant Examiner*—Paul Contino
(74) *Attorney, Agent, or Firm*—Winston & Strawn LLP

(57) ABSTRACT

Methods and apparatus for automatically detecting when a memory system has significantly degraded are disclosed. According to one aspect of the present invention, a method for determining a status associated with a memory system which includes a plurality of sectors includes updating a counter, comparing the counter to a threshold value, and generating an appropriate indication when comparing the counter to the threshold value yields a first result. The counter is updated each time a sector is reassigned, and indicates a number of sectors remaining in the memory system. The threshold value indicates a number of sectors which are yet to be reassigned in order for the memory system to be considered as useable, or reliable. The indication is generated when comparing the counter to the threshold value yields a first result to indicate that the memory system is substantially near a failure condition.

15 Claims, 4 Drawing Sheets

U.S. PATENT DOCUMENTS

| | | | |
|---|---|---|---|
| 6,249,838 B1 | 6/2001 | Kon | 711/103 |
| 6,249,887 B1 | 6/2001 | Gray et al. | 714/47 |
| 6,266,199 B1 | 7/2001 | Gillis et al. | 360/31 |
| 6,345,001 B1* | 2/2002 | Mokhlesi | 365/185.33 |
| 6,426,893 B1 | 7/2002 | Conley et al. | |
| 6,446,223 B1* | 9/2002 | Morishita et al. | 714/47 |
| 6,643,725 B1* | 11/2003 | Kozakai et al. | 710/300 |
| 6,944,063 B2 | 9/2005 | Chen et al. | |
| 6,948,026 B2* | 9/2005 | Keays | 711/103 |
| 2002/0091965 A1* | 7/2002 | Moshayedi | 714/8 |

OTHER PUBLICATIONS http://www.maxtor.com/products/DiamondMax/techsupport/white papers/smart3.html.

http://www.ariolic.com/activesmart/.

"International Search Report," corresponding PCT Application No. PCT/US03/00788, PCT International Searching Authority, May 23, 2003, 5 pages.

Notification of Transmittal of the International Preliminary Examination Report, issued in corresponding PCT/US03/00788, dated Dec. 9, 2003, 3 pages.

Written Opinion, issued in corresponding PCT/US03/00788, dated Oct. 13, 2003, 2 pages.

* cited by examiner

METHOD AND APPARATUS FOR DYNAMIC DEGRADATION DETECTION

BACKGROUND OF THE INVENTION

1. Field of Invention

The present invention relates generally to mass digital data storage systems. More particularly, the present invention relates to systems and methods for automatically determining when a digital data storage system is nearing a fault condition or an end of life.

2. Description of the Related Art

The use of non-volatile memory systems such as flash memory storage systems is increasing due to the compact physical size of such memory systems, and the ability for non-volatile memory to be repetitively reprogrammed. The compact physical size of flash memory storage systems facilitates the use of such storage systems in devices which are becoming increasingly prevalent. Devices which use flash memory storage systems include, but are not limited to, digital cameras, digital camcorders, digital music players, handheld personal computers, and global positioning devices. The ability to repetitively reprogram non-volatile memory included in flash memory storage systems enables flash memory storage systems to be used and reused.

As the life of a flash memory storage system is limited, i.e., a flash memory storage system will typically wear out after some amount of use, a flash memory storage system generally must eventually be replaced. A flash memory system that has significantly degraded may fail to retain data reliably, e.g., in sectors or blocks that are worn. A decision as to when it may be appropriate to replace a flash memory storage system may be made when a user notices that the performance of the flash memory storage system is deteriorating, e.g., when a write process is slower than expected. That is, a user may decide to replace a flash memory system based upon his belief that the flash memory system may be nearing the end of its useful life, or may be nearing a fault condition. More typically, however, a user may not realize that it may be necessary to replace a flash memory storage system until the flash memory storage system fails in some way. For example, a user may not realize that a flash memory storage system has substantially reached the end of its useful life or is nearing a fault condition until an attempt to either write data to or retrieve data from the flash memory system fails. A failed attempt to either write data or retrieve data may prove, in some cases, to be relatively catastrophic.

A memory system such as hard disk drive systems may include the capability to generate warnings when a fault condition is near. To monitor the life of hard disk drive systems, some hard disk drive manufacturers provide a feature set that is consistent with a Self-Monitoring, Analysis and Reporting Technology (SMART) feature set. A SMART feature set essentially monitors the internal operations of a hard disk drive and provides warnings pertaining to problems, e.g., an end of life condition, as will be appreciated by those skilled in the art. Diagnostics associated with a SMART feature set are typically run off-line, i.e., when the hard disk drive is not currently processing active commands or servicing user requests.

While the off-line failure prediction process associated with a SMART feature set is generally effective in determining when a hard disk drive may be nearing the end of its useful life or approaching a fault condition, an off-line failure prediction process associated with a SMART feature set often may not initiated, or when initiated, may often not be completed. In other words, an off-line failure prediction process may not be implemented and completed often enough to enable a warning to be generated when the hard disk drive is either near the end of its useful life or near a fault condition. As the implementation of an off-line failure prediction process occurs substantially only when the hard disk drive is not processing active commands or servicing user requests, when a hard disk drive continually has commands to process and requests to service, it may not be possible for an off-line failure prediction process to be initiated. In addition, when an off-line failure prediction process is initiated, the process may not be completed if the computer system which includes the hard disk drive attempts to use the hard disk drive.

The ability to provide an indication of when a hard disk drive or a flash memory system is nearing the end of its useful life or nearing a fault condition would enable a user to act to ensure that his or her data may be retained reliably within the hard disk drive of the flash memory system. While some hard disk drives include the capability to warn a user of when the hard disk drive might be about to fail, even such hard disk drives may not always successfully execute operations to determine when the hard disk drive is about to fail since such operations generally occur off-line and, hence, may fail to occur on occasion, or may be interrupted once they are initiated, as discussed above.

Therefore, what is needed is a method and an apparatus for dynamically determining when a memory device may be either near the end of its useful life or near a fault condition. Specifically, what is desired is a method and an apparatus which enables dynamic predicts to be made as to when a flash memory system may be about to fail or may be about to meet a fault condition.

SUMMARY OF THE INVENTION

The present invention relates to a system and a method for automatically detecting when a memory system has degraded. According to one aspect of the present invention, a method for determining a status associated with a memory system which includes a plurality of spare units of erase, e.g., sectors, includes updating a counter, comparing the counter to a threshold value, and generating an appropriate indication when comparing the counter to the threshold value yields a first result. The counter is updated each time a spare unit of erase is reassigned, and indicates a number of spare units of erase remaining in the memory system. The threshold value indicates a number of spare units of erase which have not yet been reassigned in order for the memory system to be considered as useable, or reliable. The indication is generated when comparing the counter to the threshold value yields a first result to indicate that the memory system is substantially near a failure condition. In one embodiment, updating the counter includes decrementing the counter each time a spare unit of erase of the plurality of spare units of erase is reassigned.

In another embodiment, comparing the counter to the threshold value includes determining when a value of the counter is less than or equal to the threshold value. In such an embodiment, the first result may indicate that the value of the counter is less than or equal to the threshold value.

Determining when a storage device is potentially about to near the end of its useful life, e.g., about to become substantially less reliable, or potentially about to encounter a fault condition before the storage device effectively fails may allow a user to take appropriate actions to effectively ensure that his or her data will not be lost or stored unreliably. When a user is notified that a current storage device is effectively on the verge of becoming unreliable, the user may replace the current storage device with a different storage device, or back up the data stored on the storage device before the current storage device actually fails or encounters a fault condition. As a result, the user may essentially reduce the likelihood that his or her data is stored in an unreliable manner.

According to another aspect of the present invention, a memory system for storing information includes a plurality of units of erase, a plurality of spare units of erase, a first storage element, and a controller. The first storage element contains a counter which indicates a number of spare units of erase included in the plurality of spare units of erase and a threshold which indicates a number of spare units of erase which are not to be reassigned. The controller dynamically updates the counter each time a spare unit of erase of the plurality of spare units of erase is reassigned. The counter indicates a number of spare units of erase included in the plurality of spare units of erase which have not yet been reassigned. The controller also compares the counter to the threshold value to determine if the memory system is substantially near a condition that characterizes the memory system as being substantially unreliable.

In one embodiment, the controller attempts to write data to a first unit of erase included in the plurality of units of erase, and to determine if the first unit of erase is worn. In such an embodiment, when it is determined that the first unit of erase is worn, the controller reassigns a first spare unit of erase included in the plurality of spare units of erase as the first unit of erase. In another embodiment, the controller may attempt to write data to a first unit of erase included in the plurality of units of erase, and to determine if the first unit of erase is defective, e.g., when the units of erase are verified after programming.

According to still another aspect of the present invention, a method for determining a status associated with a non-volatile memory system that includes a plurality of spare units of erase includes automatically determining when the non-volatile memory system is nearing a condition which renders the non-volatile memory system as being substantially unreliable. The method also includes automatically generating an indication when it is determined that the non-volatile system is nearing the condition which renders the non-volatile memory system as being substantially unreliable. The indication indicates that the non-volatile system is nearing the condition which renders the non-volatile memory system as being substantially unreliable. In one embodiment, the condition which renders the non-volatile memory systems as being substantially unreliable when comparing the counter to the threshold value yields the first result is either an end-of-life condition or a fault condition.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

Figure 1A:
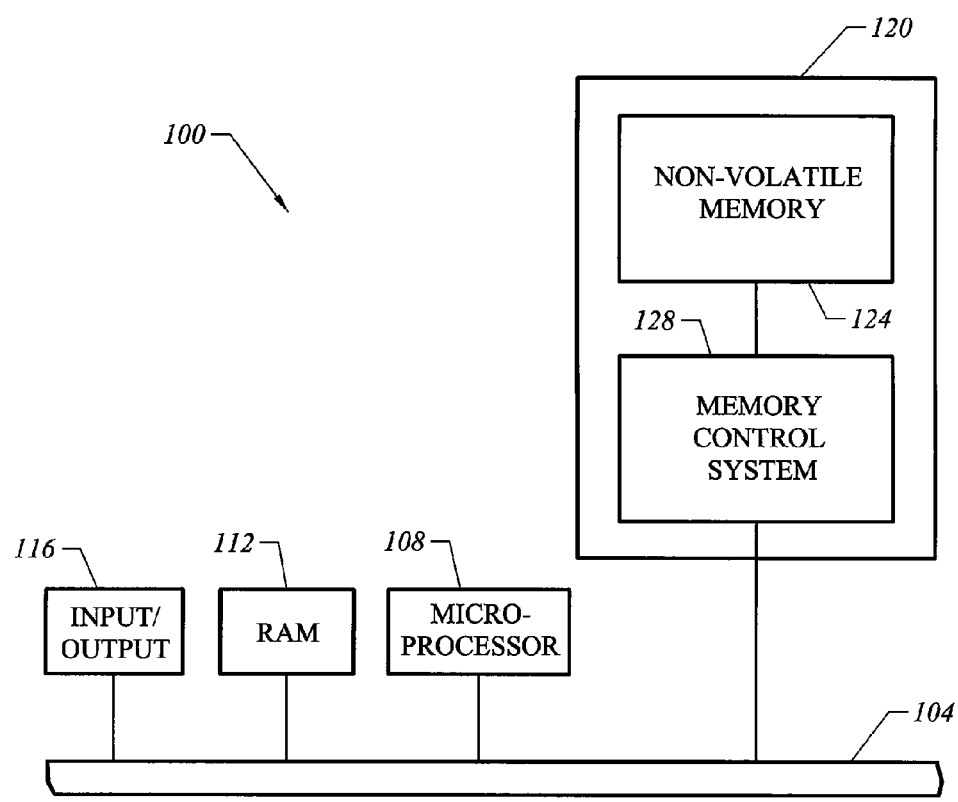
FIG. 1a is a diagrammatic representation of a general host system which includes a non-volatile memory device in accordance with an embodiment of the present invention.

The ability to determine when a storage device is potentially about to near the end of its useful life, e.g., about to become substantially less reliable, or potentially about to encounter a fault condition may allow a user to take appropriate action to effectively ensure that his or her data will be reliably stored. By way of example, the user may elect to replace the current storage device with a different storage device before the current storage device actually fails or encounters a fault condition.

Often, a storage device is considered as being near the end of its useful life when the number of spare sectors which are available to be reassigned, as for example when sectors that are in use wear out, reaches a critical level. By dynamically tracking the number of spare sectors remaining in the storage device and updating an associated counter each time a spare sector is reassigned, determinations may be made regarding whether the number of remaining spare sectors has reached a critical level, e.g., a level at which the storage device is considered as having reached an end-of-life condition. A warning may be generated when it is automatically determined that the storage device has reached an end-of-life condition, e.g., a condition where there are few spare sectors or an insufficient number of spare sectors remaining to replace worn sectors, to warn a user of a potentially impending failure.

Dynamically maintaining a count of the available spare sectors in a storage device and determining when the count reaches a critical level, e.g., using a controller associated with the memory device, enables the flash sector degradation of the storage device to be monitored substantially without using background or off-line operations. As such, processes of determining when a storage device is nearing the end of its useful life or a fault condition may occur substantially automatically. In addition, the overhead associated with maintaining a count of spare sectors, and determining when the count reaches a critical level, that is added to the overhead associated with reassigning spare sectors is relatively low. Hence, maintaining a count of spare sectors and determining when the count reaches a critical level may occur efficiently.

Since maintaining a count of spare sectors and determining when the count reaches a critical level occurs substantially automatically during or substantially immediately after a reassign operation, a process of assessing the degradation within a storage device may occur substantially without being preempted or interrupted. That is, as determinations of when the count reaches a critical level, i.e., determinations of whether a storage device has degraded to the point that the storage device is considered unreliable, generally do not occur only when the storage device is offline and has no active processes, the determinations typically are not interrupted and prevented from being completed. Therefore, a determination that a storage device has likely become unreliable may occur substantially as soon as the count of spare sectors reaches a critical level.

When data is to be stored on a memory or storage device such as a non-volatile memory device, a host system may provide the data to the non-volatile memory device. Within the non-volatile memory device, the data may be stored in sectors or blocks. Referring initially to FIG. 1a, a general host system which includes a non-volatile memory device, e.g., a CompactFlash memory card, will be described. A host or computer system 100 generally includes a system bus 104 which allows a microprocessor 108, a random access memory (RAM) 112, and input/output circuits 116 to communicate. It should be appreciated that host system 100 may generally include other components, e.g., display devices and networking device, which are not shown for purposes of illustration.

In general, host system 100 may be capable of capturing information including, but not limited to, still image information, audio information, and video image information. Such information may be captured in real-time, and may be transmitted to host system 100 in a wireless manner. While host system 100 may be substantially any system, host system 100 is typically a system such as a digital camera, a video camera, a cellular communications device, an audio player, or a video player. It should be appreciated, however, that host system 100 may generally be substantially any system which stores data or information.

A non-volatile memory device 120 which, in one embodiment, is a removable non-volatile memory device, is arranged to interface with bus 104 to store information. Non-volatile memory device 120 includes non-volatile memory 124 and a memory control system 128. In one embodiment, non-volatile memory device 120 may be implemented on a single chip or a die. Alternatively, non-volatile memory device 120 may be implemented on a multi-chip module.

Non-volatile memory 124 is arranged to store data such that data may be accessed and read or written as needed from sectors or blocks (not shown) that are associated with storage elements (not shown), e.g., cells, in non-volatile memory 124. Data stored in non-volatile memory 124 may also be erased and programmed as appropriate. The processes of storing data, reading data, and erasing data are generally controlled by memory control system 128.

Non-volatile memory device 120 has generally been described as including a memory control system 128, i.e., a controller. Often, non-volatile memory device 120 may include separate chips for non-volatile memory 124 and memory control system 128, i.e., controller, functions. By way of example, while non-volatile memory devices including, but not limited to, PC cards, CompactFlash cards, MultiMedia cards, and secure digital cards include controllers which may be implemented on a separate chip, other non-volatile memory devices may not include controllers that are implemented on a separate chip. In an embodiment in which non-volatile memory device 120 does not include separate memory and controller chips, the memory and controller functions may be integrated into a single chip, as will be appreciated by those skilled in the art. It should be appreciated that non-volatile memory device 120 may also be a Memory Stick card, a Smart Media card, and a Secure Digital card.

In general, data may be written to sectors in non-volatile memory 124 when the data is to be stored within non-volatile memory device 124. If the sector is available and not worn out, then the data is generally successfully written to the sector. However, if it is determined that a current sector in which data is to be written is worn out, then a spare sector is mapped or reassigned to be the new current sector, and the new data is written into the new current sector. When a sector is determined to be worn out or defective, the sector is typically deemed to be unsuitable for use in storing data, as the sector may store the data in an unreliable manner. In the event that there are no spare sectors to map to the worn out or defective sector, then non-volatile memory device 124 may be considered to be failed, or at the end of its useful life.

Figure 1B:
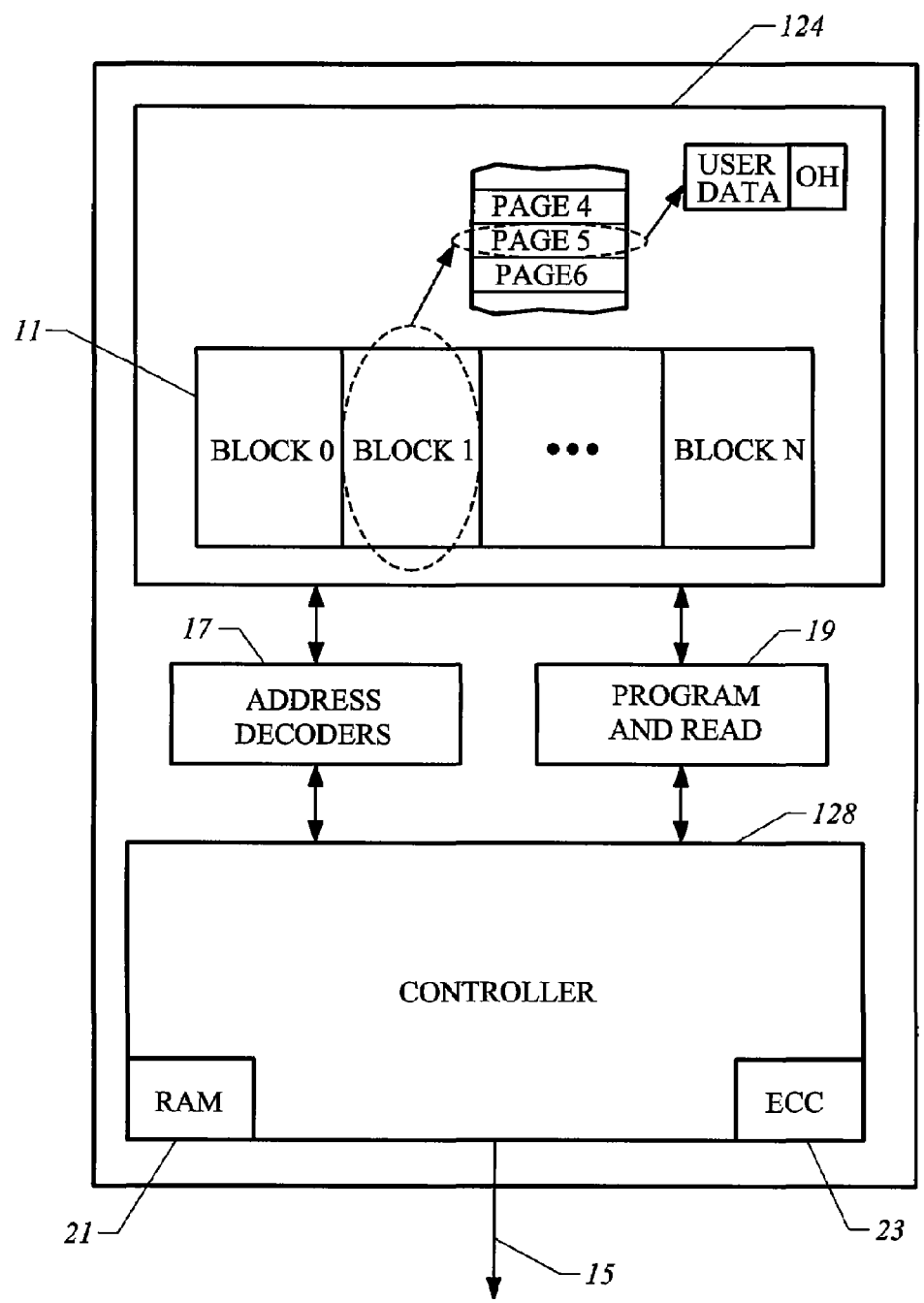
FIG. 1b is a diagrammatic representation of a non-volatile memory device, e.g., non-volatile memory device 120 of FIG. 1a, in accordance with an embodiment of the present invention.

Referring next to FIG. 1b, non-volatile memory device 120 will be described in more detail in accordance with an embodiment of the present invention. As described above, non-volatile memory device 120 includes non-volatile memory 124 and memory control system 128. Memory 124 and control system 128, or controller, are primary components of non-volatile memory device 120. Memory 124 may be an array of memory cells formed on a semiconductor substrate, wherein one or more bits of data are stored in the individual memory cells by storing one of two or more levels of charge on individual storage elements of the memory cells. A non-volatile flash electrically erasable programmable read only memory (EEPROM) is an example of a common type of memory for such systems. One suitable flash EEPROM system is described in U.S. Pat. No. 5,602,987, which is incorporated herein by reference in its entirety.

Control system 128 communicates over a bus 15 to a host computer or other system that is using the memory system to store data. Bus 15 is generally a part of bus 104 of FIG. 1a. Control system 128 also controls operation of memory 124, which may include a memory cell array 11, to write data provided by the host, read data requested by the host and perform various housekeeping functions in operating memory 124. Control system 128 generally includes a general purpose microprocessor which has associated non-volatile software memory, various logic circuits, and the like. One or more state machines are often also included for controlling the performance of specific routines.

Memory cell array 11 is typically addressed by control system 128 through address decoders 17. Decoders 17 apply the correct voltages to gate and bit lines of array 11 in order to program data to, read data from, or erase a group of memory cells being addressed by the control system 128. Additional circuits 19 include programming drivers that control voltages applied to elements of the array that depend upon the data being programmed into an addressed group of cells. Circuits 19 also include sense amplifiers and other circuits necessary to read data from an addressed group of memory cells. Data to be programmed into array 11, or data recently read from array 11, are typically stored in a buffer memory 21 within control system 128. Control system 128 also usually contains various registers for temporarily storing command and status data, and the like.

Array 11 is divided into a large number of BLOCKS 0—N of memory cells. As is common for flash EEPROM systems, the block may be the unit of erase. That is, each block may contain the minimum number of memory cells that are erased together. It should be appreciated that a unit of erase may be commonly referred to as a sector, a block, a page, or any similar term as known to those skilled in the magnetic and semiconductor data storage arts, or similar terms known to those skilled in other data storage arts. Each block is typically divided into a number of pages, as also illustrated in FIG. 1b. A page may be the unit of programming. That is, a basic programming operation generally writes data into a minimum of one page of cells. One or more sectors of data are typically stored within each page. As shown in FIG. 1b, one sector includes user data and overhead data (OH). Overhead data typically includes an error correction code (ECC) that has been calculated from the user data of the sector. A portion 23 of the control system 13 calculates the ECC when data is being programmed into array 11, and also checks the ECC when data is being read from array 11. Alternatively, the ECCs are stored in different pages, or different blocks, than the user data to which they pertain.

A sector of user data is typically 512 bytes, corresponding to the size of a sector in magnetic disk drives. Overhead data is typically an additional 28 bytes. One sector of data is most commonly included in each page but two or more sectors may instead form a page. A large number of pages form a block, anywhere from 8 pages, for example, up to 512, 1054 or more pages. The number of blocks is chosen to provide a desired data storage capacity for the memory system. Array 11 is typically divided into a few sub-arrays (not shown), each of which contains a proportion of the blocks, which operate somewhat independently of each other in order to increase the degree of parallelism in the execution of various memory operations. An example of the use of multiple sub-arrays is described in U.S. Pat. No. 5,890,192, which is incorporated herein by reference in its entirety.

Figure 2:
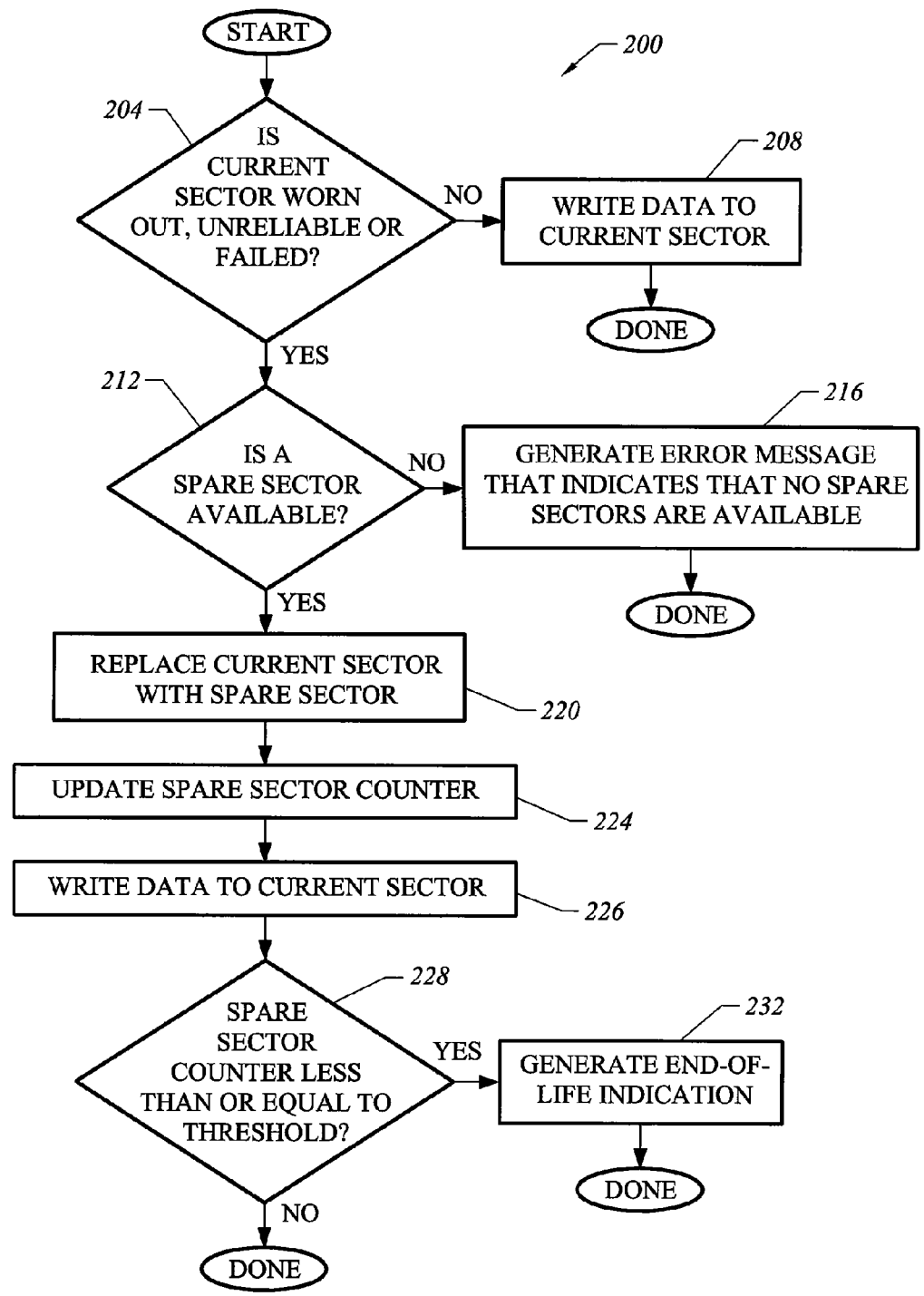
FIG. 2 is a process flow diagram which illustrates the steps associated with attempting to write data to a sector associated with a memory device in accordance with an embodiment of the present invention.

With reference to FIG. 2, one method of attempting to write data to a sector or storage element will be described in accordance with an embodiment of the present invention. Typically, an attempt to write data to a sector occurs at the request of a host system with which a memory device is associated. A process 200 of attempting to write data to a current sector, or a current unit of erase, in a memory device begins at step 204 in which a determination is made as to whether the current sector is either worn out, unreliable, or failed. As will be appreciated by those skilled in the art, when a sector is worn out, the sector has effectively been erased too many times for the sector to be considered to be reliable for use in storing data. If it is determined in step 204 that the current sector is not worn out, unreliable, or failed, then the indication is that data may be written to the current sector. Accordingly, in step 208, data is written to the current sector, and the process of attempting to write data to the current sector is successfully completed.

Alternatively, if it is determined that the current sector is either worn out, unreliable, or failed, then process flow proceeds to step 212 in which a determination is made regarding whether a spare sector is available. In other words, it is determined in step 212 if there is a spare sector available which may be reassigned for use as a new current sector. If it is determined that there is no spare sector available, then an error message is generated in step 216 to indicate that there are no spare sectors available. In one embodiment, such an error message may be an end-of-life indication which indicates that data may not be written to the memory device as the memory device has degraded to the point where no spare sectors are available. The error message may be generated such that the error message may be displayed on a display screen of a device, e.g., host, which is attempting to write data to the memory device. Once the error message is generated, the process of attempting to write data to the current sector is completed.

If the determination in step 212 is that a spare sector is available, then the current sector is replaced with the spare sector, i.e., the spare sector is reassigned as the new current sector while the current sector is marked as being a bad sector, in step 220. Substantially any suitable method may be used to replace the current sector with a spare sector. After the current sector is replaced with the spare sector, the spare sector counter is updated in step 224. Typically, updating the spare sector counter is considered to be part of a sector reassign operation. As previously discussed, a spare sector counter is an indicator of how many spare sectors remain available within a memory device. In the described embodiment, updating the spare sector counter includes dynamically or automatically decrementing the spare sector counter to account for the fact that one of the spare sectors has been reassigned as the current sector.

Once the spare sector counter is updated, data is written to the new current sector 226. That is, data is written into the reassigned spare sector, or the spare sector which was reassigned as the new current sector in step 220. After data is written to the new current sector, it is determined in step 228 whether the spare sector counter is less than or equal to a threshold. The threshold generally represents a minimum number of spare sectors which are to be available within a memory device in order for the memory device to be rendered as functional, i.e., the threshold represents a critical level or critical number of spare sectors in the memory device. If it is determined that the spare sector counter is greater than the threshold, then the process of attempting to write data to the current sector is completed.

Alternatively, when the spare sector counter is determined to be less than or equal to the threshold in step 228, the indication is that the memory device may be nearing the end of its life or nearing a fault condition, e.g., the end of its usefulness as a reliable storage medium. Accordingly, if it is determined that the spare sector counter is either less than or equal to the threshold, an end-of-life indication is generated in step 232. The end-of-life indication may generally indicate that a future write operation may not be successful due to a lack of available spare sectors, i.e., due to the increased potential for a fault condition to arise or an increased potential for data to be stored unreliably. Upon generating the end-of-life indication, the process of attempting to write data to the current sector is completed. In one embodiment, the end-of-life indication may be maintained or otherwise saved such that the end-of-life indication may be returned as an error or returned as a response to a query from a host system.

A spare sector counter may generally be maintained by a memory controller, e.g., memory control system 128 of FIG. 1. In one embodiment, when a memory device such as a flash memory card is manufactured, a number of sectors or blocks in the memory device are set aside as spare sectors, a threshold is determined, and the spare sector counter is initiated. That is, at manufacturing time, in addition to allocating spare sectors, a reserved system sector may be written with a counter which effectively defines the number of spare sectors which remain on the memory device, and a minimum number of spare sectors which are to remain as spare sectors to prevent an end-of-life indication is defined. The threshold that is determined may also be written into a reserved system sector at manufacturing time. Both the counter and the threshold may be stored as bits within the reserved system sector.

Figure 3:
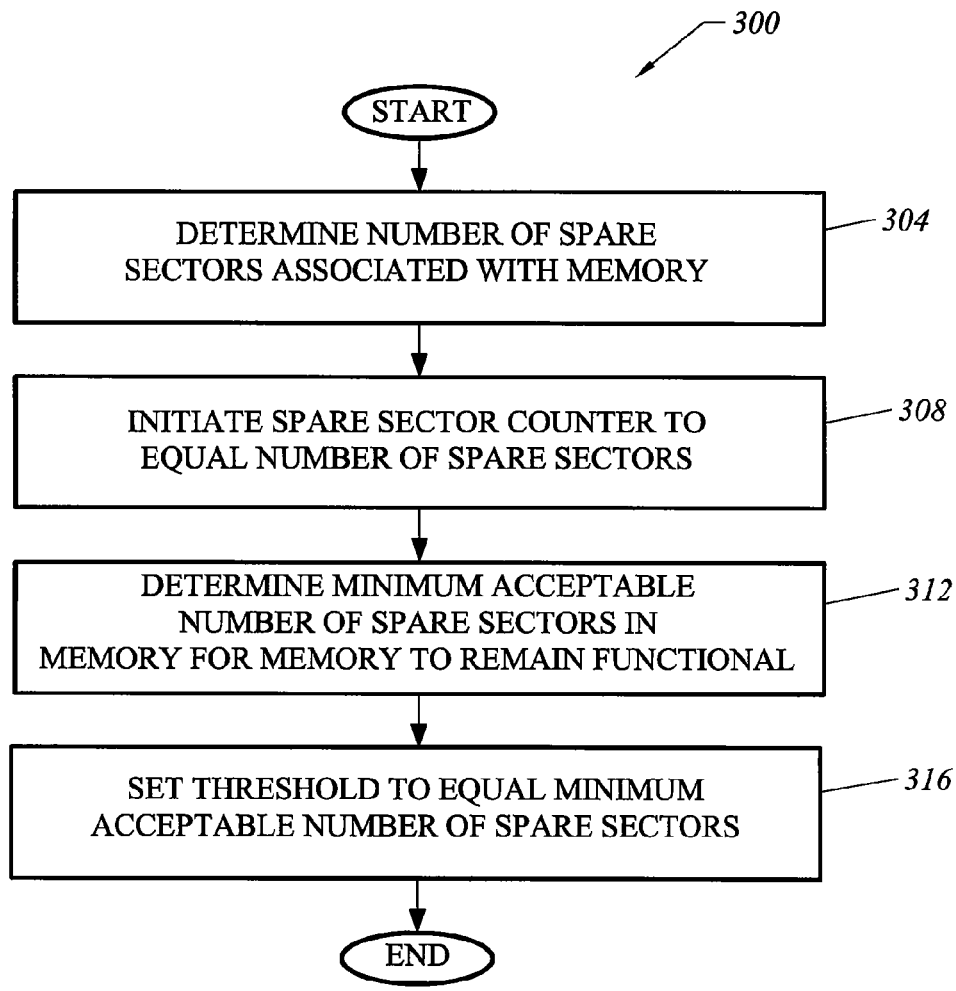
FIG. 3 is a process flow diagram which illustrates the steps associated with configuring a memory device during manufacture in accordance with an embodiment of the present invention.

With reference to FIG. 3, one process of configuring a memory device during manufacture will be described in accordance with an embodiment of the present invention. For ease of discussion, steps which are associated with configuring a memory device, but are not directly related to initiating a spare sector counter, have not been shown. A process 300 of configuring a memory device during manufacture begins at step 304 in which the number of spare sectors that are to be associated with the memory device is determined. The number of spare sectors, or sectors that are reserved for internal use with respect to the memory device, may vary widely depending upon the requirements associated with a particular memory device. In general, spare sectors are reserved such that when sectors which are used to store data wear out, those sectors may be mapped substantially transparently to the spare sectors.

Once the number of spare sectors is determined, a spare sector counter is initiated in step 308 by the memory controller associated with the memory device. The spare sector counter may generally be stored in a sector associated with the memory device, e.g., a reserved system sector. Typically, the spare sector counter is initiated to have a value that is substantially equal to the number of spare sectors associated with the memory device.

In step 312, a minimum acceptable number of spare sectors which is considered to be needed for the memory device to be characterized as functional is determined. That is, a lower limit on the number of spare sectors is determined such that when the actual number of spare sectors falls below the lower limit, the memory device is considered to be at or near the end of its useful life. Generally, the lower limit is selected to be at a level which meets requirements, e.g., performance requirements, associated with the memory device. After the lower limit is selected, the lower limit is set in step 316 to be a threshold, i.e., the threshold to which the spare sector counter is compared in step 228 of FIG. 2. Like the spare sector counter, the threshold may also be stored in a sector associated with the memory device. Once the threshold is set, the process of configuring the memory device is completed.

Although only a few embodiments of the present invention have been described, it should be understood that the present invention may be embodied in many other specific forms without departing from the spirit or the scope of the present invention. By way of example, in lieu of maintaining a spare sector counter which is decremented to facilitate a determination of when a memory system or device is nearing the end of its life or a fault condition, a spare sector counter which is incremented may be used. A spare sector counter which is incremented each time a spare sector is reassigned may be compared to a threshold which specifies the number of spare sectors which, when used, indicate that the memory device is near the end of its life. When the incremented spare sector counter has a value that is either equal to or greater than the threshold, e.g., a critical number of spare sectors which are reassigned before the overall memory device is generally considered to be near the end of its life, then an end-of-life indication may be generated. Alternatively, a spare sector counter may be initiated such that the spare sector counter is decremented by a threshold amount such that the spare sector counter indicates the number of sectors which are to be reassigned before an end-of-life indication is generated.

As will be appreciated by those skilled in the art, a non-volatile storage device such as a flash memory card, e.g., a CompactFlash card, often includes more than one chip. Each chip generally includes its own set of spare sectors. When there are no spare sectors remaining on a first chip but a second chip still includes spare sectors, the spare sectors associated with the second chip may not necessarily be reassigned to worn out sectors on the first chip, due to performance penalties associated with such a reassignment. In one embodiment, each chip may have its own spare sector counter and its own threshold, or critical level, of spare sectors. That is, a storage device may include a spare sector counter and a threshold for each chip associated with the storage device. In such an embodiment, when any chip within the storage device has a spare sector counter which indicates that a critical level of spare sectors has been reached, an end-of-life indication may be generated, even if another chip within the storage device still includes an adequate number of spare sectors.

While the present invention has been described as being suitable for use in dynamically detecting degradation associated with a non-volatile memory system such as a flash memory card, it should be understood that the present invention may generally be applied for use in dynamically detecting degradation in substantially any memory system or storage device. For instance, a dynamic detection algorithm which keeps track of available spare sectors may be applied to detect degradation in sectors of a hard disk drive or to detect defects in sectors of a hard disk drive. In other words, a spare sector counter may be automatically maintained with respect to a hard disk drive to facilitate a determination of when the hard disk drive may be nearing the end of its useful life or nearing a fault condition. Additionally, the present invention may generally be applied for use in both non-volatile and volatile memory systems.

A controller that is part of a memory system in which data is to be stored has generally been described as being suitable for use in causing a spare sector counter to be updated, and for use in comparing the spare sector counter to a threshold. Both the spare sector counter and the threshold are stored within the memory system. A spare sector counter and a threshold may also typically be maintained for a memory system which does not include a controller, e.g., a Smart Media card. For a memory system which does not include a controller, the spare sector counter and the threshold may be stored on the memory system. When a spare sector is reassigned, e.g., by a controller associated with a host which interfaces with the memory system, the controller associated with the host may access the spare sector counter and update the spare sector counter. In addition, the controller associated with the host may also perform a comparison between the spare sector counter and the threshold, and generate an end-of-life indication, if appropriate, without departing from the spirit or the scope of the present invention.

The present invention has been described in terms of being applicable to keeping track of sectors, e.g., spare sectors. It should be appreciated that sectors may generally be considered to be units of erase. More specifically, a unit of erase may be commonly referred to as a sector, a block, a page, or substantially any similar term, as will be understood by those of skill in the art. Hence, the dynamic degradation detection processes of the present invention may generally be applied to units of erase.

In general, the steps associated with attempting to write data, as well as the steps associated with setting up a threshold and a spare sector counter may be widely varied. Steps may be added, removed, altered, and reordered without departing from the spirit or the scope of the present invention. For instance, in a process of attempting to write data, a determination of whether a spare sector counter is less than or equal to a threshold value may precede writing data to a new current sector. In other words, in lieu of writing data to a new current sector prior to checking a spare sector counter against a threshold, it may be possible for no data to be written to the new current sector unless it is determined that the spare sector counter is not less than or equal to the threshold. Therefore, the present examples are to be considered as illustrative and not restrictive, and the invention is not to be limited to the details given herein, but may be modified within the scope of the appended claims.

What is claimed is:

1. A memory system for storing information, the memory system comprising:
   a first plurality of spare units of erase on a first chip;
   a second plurality of spare units of erase on a second chip;
   a first storage element on the first chip, the first storage element containing a first counter and a first threshold, the first counter indicating a number of spare units of erase on the first chip which have not yet been reassigned;
   a second storage element on the second chip; the second storage element containing a second counter and a second threshold, the second counter indicating a number of spare units of erase on the second chip which have not yet been reassigned;
   a controller, the controller updating the first counter each time a spare unit of erase of the first plurality of spare units of erase is reassigned, the controller comparing the first counter to the first threshold value, the controller updating the second counter each time a spare unit of erase of the second plurality of spare units of erase is reassigned, the controller comparing the second counter to the second threshold value, the controller generating an end-of-life indicator when either the first counter reaches the first threshold or the second counter reaches the second threshold; and
   wherein the memory system operates in conjunction with a host system and the controller reassigns a spare unit of erase in response to a request from the host system.

2. The memory system of claim 1 wherein when the controller compares the first counter to the first threshold value to determine if the memory system is in an end-of-life the condition, the controller determines that the memory system is in the end-of-life condition when a value of the first counter is less than or equal to the first threshold value.

3. The memory system of claim 1 wherein the controller attempts to write data to a first unit of erase on the first chip, and determines if the first unit of erase is worn.

4. The memory system of claim 3 wherein when it is determined that the first unit of erase is worn, the controller reassigns a first spare unit of erase included in the first plurality of spare units of erase as the first unit of erase.

5. The memory system of claim 4 wherein the controller writes the data into the reassigned first spare unit of erase.

6. The memory system of claim 1 wherein the controller attempts to write data to a first unit of erase on the first chip to determine if the first unit of erase is defective.

7. The memory system of claim 6 wherein when it is determined that the first unit of erase is defective, the controller reassigns a first spare unit of erase included in the first plurality of spare units of erase as the first unit of erase.

8. The memory system of claim 7 wherein the controller writes the data into the reassigned first spare unit of erase.

9. The memory system of claim 1 wherein an individual one of the first plurality of spare units of erase is a sector, and an individual one of the second plurality of spare units of erase is a spare sector.

10. The memory system of claim 1 further including:
    a non-volatile memory, wherein the first plurality of spare units of erase, the second plurality of spare units of erase, and the first storage element are included in the non-volatile memory.

11. The memory system of claim 1 wherein the memory system is a non-volatile memory system.

12. The memory system of claim 1 wherein the memory system is one of a PC card, a CompactFlash card, a MultiMedia card, a MemoryStick card, and a Secure Digital card.

13. The system of claim 1 wherein the host system is arranged to capture information and to attempt to store the information in the memory system.

14. The system of claim 13 wherein the information is one of audio information and wireless information.

15. The system of claim 14 wherein the host system is one of a cellular communications device, and audio player, and a video player.

* * * * *

UNITED STATES PATENT AND TRADEMARK OFFICE
CERTIFICATE OF CORRECTION

PATENT NO. : 7,246,268 B2 Page 1 of 1
APPLICATION NO. : 10/051833
DATED : July 17, 2007
INVENTOR(S) : Jeffrey Craig and John S. Mangan It is certified that error appears in the above-identified patent and that said Letters Patent is hereby corrected as shown below:

<u>Column 12</u>:
Line 34 (claim 15, line 2), after "device,", delete "and", insert -- an --.

Signed and Sealed this

Twenty-seventh Day of November, 2007

JON W. DUDAS
*Director of the United States Patent and Trademark Office*